United States Patent
Chudzik et al.

(10) Patent No.: US 8,120,144 B2
(45) Date of Patent: Feb. 21, 2012

(54) METHOD FOR FORMING DUAL HIGH-K METAL GATE USING PHOTORESIST MASK AND STRUCTURES THEREOF

(75) Inventors: Michael P. Chudzik, Danbury, CT (US); Rashmi Jha, Toledo, OH (US); Naim Moumen, Walden, NY (US); Keith Kwong Hon Wong, Wappingers Falls, NY (US); Ying H. Tsang, Newburgh, NY (US)

(73) Assignees: International Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/018,888

(22) Filed: Feb. 1, 2011

(65) Prior Publication Data
US 2011/0121436 A1     May 26, 2011

Related U.S. Application Data

(62) Division of application No. 12/132,146, filed on Jun. 3, 2008, now Pat. No. 7,915,115.

(51) Int. Cl.
H01L 29/72 (2006.01)
(52) U.S. Cl. .......... 257/532; 438/216; 438/703; 216/41; 216/49; 430/322; 430/329
(58) Field of Classification Search .................. 257/532; 438/216, 703; 216/41, 49; 430/322, 329
See application file for complete search history.

(56) References Cited

U.S. PATENT DOCUMENTS

| | | | |
|---|---|---|---|
| 4,861,424 A | 8/1989 | Fujimura et al. | |
| 6,235,453 B1 | 5/2001 | You et al. | |
| 6,767,698 B2 | 7/2004 | Johnson | |
| 6,805,139 B1 | 10/2004 | Savas et al. | |
| 6,992,011 B2 | 1/2006 | Nemoto et al. | |
| 2007/0178637 A1* | 8/2007 | Jung et al. | 438/216 |
| 2008/0286697 A1* | 11/2008 | Verhaverbeke et al. | 430/322 |

OTHER PUBLICATIONS

U.S. Appl. No. 12/132,146, filed Jun. 3, 2008, Notice of Allowances and Fees Due dated Nov. 16, 2010.
U.S. Appl. No. 12/132,146, filed Jun. 3, 2008, Office Action dated Jun. 24, 2010.
U.S. Appl. No. 12/132,146, filed Jun. 3, 2008, Response to Restriction Requirement filed Mar. 16, 2010.
U.S. Appl. No. 12/132,146, filed Jun. 3, 2008, Restriction Requirement dated Mar. 8, 2010.

* cited by examiner

*Primary Examiner* — Edward Wojciechowicz
(74) *Attorney, Agent, or Firm* — Joseph J. Petrokaitis; Hoffman Warnick LLC

(57) ABSTRACT

Methods for forming a front-end-of-the-line (FEOL) dual high-k gate using a photoresist mask and structures thereof are disclosed. One embodiment of the disclosed method includes depositing a high-k dielectric film on a substrate of a FEOL CMOS structure followed by depositing a photoresist thereon; patterning the high-k dielectric according to the photoresist; and removing the photoresist thereafter. The removing of the photoresist includes using an organic solvent followed by removal of any residual photoresist including organic and/or carbon film. The removal of residual photoresist may include a degas process, alternatively known as a bake process. Alternatively, a nitrogen-hydrogen forming gas (i.e., a mixture of nitrogen and hydrogen) ($N_2/H_2$) or ammonia ($NH_3$) may be used to remove the photoresist mask. With the use of the plasma nitrogen-hydrogen forming gas ($N_2/H_2$) or a plasma ammonia ($NH_3$), no apparent organic residual is observed.

12 Claims, 3 Drawing Sheets

METHOD FOR FORMING DUAL HIGH-K METAL GATE USING PHOTORESIST MASK AND STRUCTURES THEREOF

This application is a divisional of U.S. patent application Ser. No. 12/132,146 filed Jun. 3, 2008, now U.S. Pat. No. 7,915,115, which received a Notice of Allowance on Nov. 16, 2010.

BACKGROUND

1. Technical Field

The disclosure relates generally to fabrication of gate structure during formation of a semiconductor structure in complementary metal oxide semiconductor (CMOS) circuits, and more particularly, to methods of forming a dual high dielectric constant (high-k) front-end-of-the-line (FEOL) metal gate using photoresist mask.

2. Related Art

In the current state of the art, patterning of high-k dielectrics uses photoresist as a soft mask in place of hard mask techniques because silicon oxide ($SiO_2$) or silicon nitride ($Si_2N_3$) interact/react with high-k dielectrics changing the properties of the high-k dielectrics for the fabrication of semiconductor structures in CMOS circuits. Photoresist for patterning of high-k materials is removed using organic solvents in view of the sensitivity of the patterned high-k dielectric materials to standard wet processes.

However, photoresist removal by organic solvents/chemicals is usually incomplete leaving residual carbon on the surface of high-k dielectric films on the substrate. Incomplete removal of photoresist may affect the fabrication of subsequent layers on the patterned high-k dielectrics and consequently the performance of the gate structure fabricated therefrom. For example, unremoved residual photoresist on high-k dielectric may cause the threshold voltage ($V_t$) to shift by more than 200 mv and the inversion thickness ($T_{inv}$) to increase by more than 2 A. Therefore, there is a need to completely remove any residual photoresist. Current techniques used in front-end-of-line (FEOL) fabrication of gate structures include wet chemical etching using sulfuric peroxide with or without the addition of oxygen plasma resist strip.

SUMMARY

Methods for forming a front-end-of-the-line (FEOL) dual high-k gate using a photoresist mask and structures thereof are disclosed. One embodiment of the disclosed method includes depositing a high-k dielectric film on a substrate of a FEOL CMOS structure followed by depositing a photoresist thereon; patterning the high-k dielectric according to the photoresist; and removing the photoresist thereafter. The removing of the photoresist includes using an organic solvent followed by removal of any residual photoresist including organic and/or carbon film. The removal of residual photoresist may include a degas process, alternatively known as a bake process. Alternatively, a nitrogen-hydrogen plasma forming gas (i.e., a mixture of nitrogen and hydrogen) ($N_2/H_2$) or plasma ammonia ($NH_3$) may be used to remove the photoresist mask. With the plasma made with the nitrogen-hydrogen forming gas ($N_2/H_2$) or ammonia ($NH_3$), no apparent organic residual is observed.

A first aspect of the disclosure provides a method for forming a front-end-of-the-line (FEOL) dual high-k gate structure, the method comprising: depositing at least one high-k dielectric layer on a substrate; forming a photoresist mask on the high-k dielectric layer; patterning the high-k dielectric according to the photoresist mask; and removing the photoresist mask and any residual photoresist material in an oxygen free environment A second aspect of the disclosure provides a semiconductor structure having a front-end-of-the-line (FEOL) device, the semiconductor structure comprising: a first high-k dielectric layer disposed on a substrate; and a second high-k dielectric layer on the first high-k dielectric layer, wherein the second high-k dielectric is patterned by: forming a photoresist mask on the second high-k dielectric layer; patterning the second high-k dielectric layer according to the photoresist mask; and removing the photoresist mask and any residual photoresist material in an oxygen free environment.

A third aspect of the disclosure provides a semiconductor structure having a front-end-of-the-line (FEOL) device, the semiconductor structure comprising: a high-k dielectric layer disposed on a substrate, wherein the high-k dielectric is patterned by: forming a photoresist mask on the high-k dielectric layer; patterning the high-k dielectric layer according to the photoresist mask; and removing the photoresist mask and any residual photoresist material in an oxygen free environment.

These and other features of the present disclosure are designed to solve the problems herein described and/or other problems not discussed.

BRIEF DESCRIPTION OF THE DRAWINGS

Various aspects of the disclosure will be more readily understood from the following detailed description taken in conjunction with the accompanying drawings that depict different embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
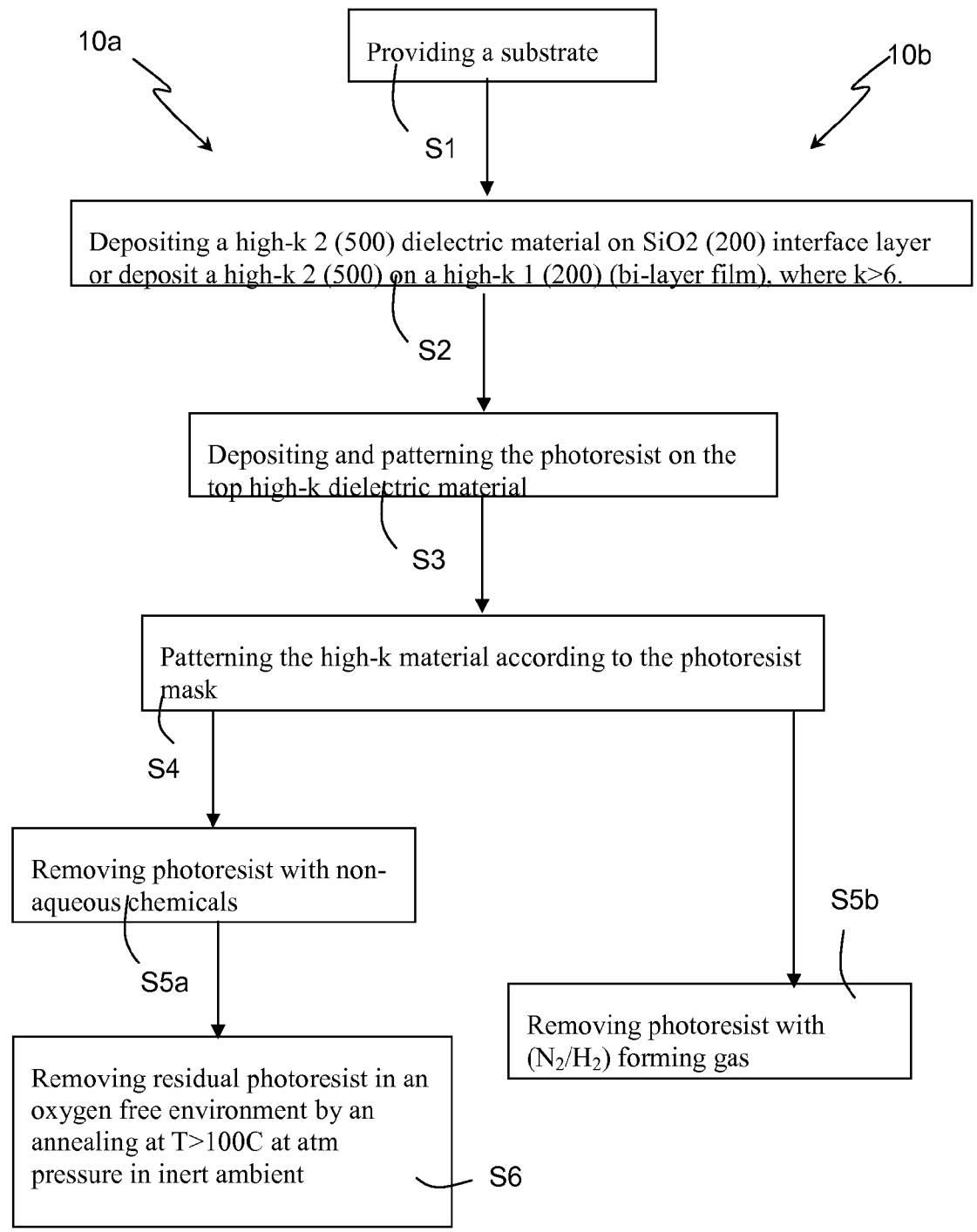
FIG. 1 is a flow diagram of a process according to the disclosure.
Figure 2A:
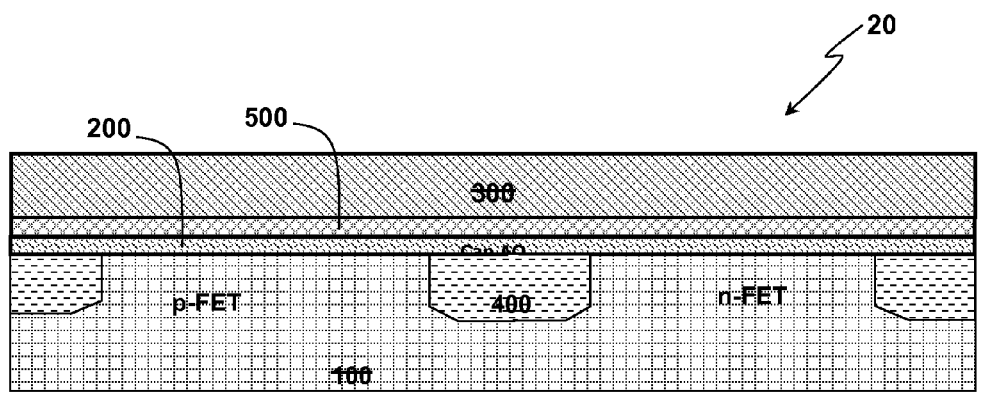
FIGS. 2a-2c are cross-sectional views of a semiconductor structure at various stages according to a method of the disclosure.
Figure 2B:
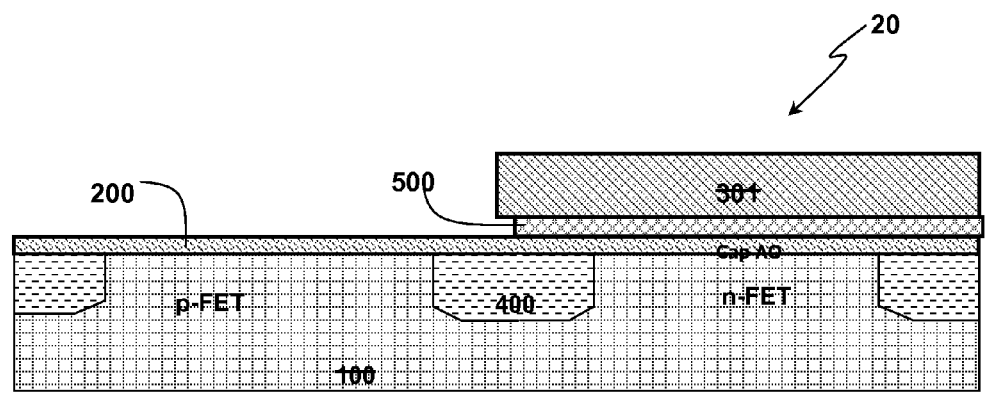
Figure 2C:
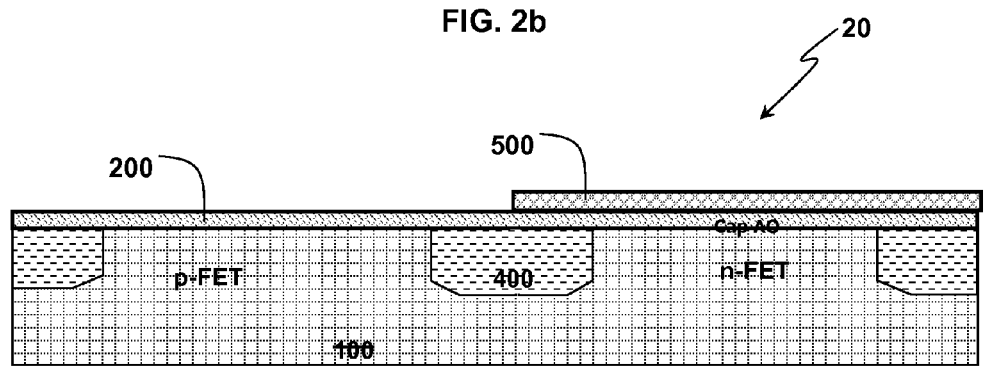

Embodiments depicted in the drawings in FIGS. 1-4 illustrate the methods and various resulting structure(s) of the different aspects of fabricating a FEOL dual high-k dielectric gate structure 20 in CMOS using a photoresist as a soft mask for patterning high-k dielectric materials disposed on a substrate 100 (FIG. 2a-2c). The substrate may include a shallow trench isolation region 400 (FIG. 2a-2c).

FIG. 1 illustrates two alternative embodiments of a process scheme 10a and 10b of the method of the disclosure. Scheme 10a includes the processes S1-S4, S5a and S6 while Scheme 10b includes processes S1-S4 and S5b. Each process scheme 10a and 10b produces a resulting semiconductor structure 20 (FIG. 2c). Details of the method for producing semiconductor structure 20 are set out in the following paragraphs.

As shown in FIG. 1, according to Scheme 10a, process S1 provide a substrate 100 and process S2 may include depositing a high-k dielectric material 200 onto substrate 100 that is carried out according to currently known methods including, for example, chemical vapor deposition, metal-organic chemical vapor deposition, atomic layer deposition, atomic layer chemical vapor deposition, low pressure chemical vapor deposition, sputtering, and anodization; or later developed techniques. The high-k dielectric material having a dielectric constant, k, where k>6, may include oxides and silicates of aluminum, zirconium, hafnium, tantalum; silicon nitride, barium strontium titanate; lead-lanthanum-zirconium-titanate; or some form of nitrided hafnium silicates (HfSiON). A second high-k dielectric layer 500 is subsequently deposited over high-k dielectric material 200 using similar fabrication techniques. The disclosed method may also form alternative embodiments with a single high-k dielectric layer 200 as shown in semiconductor structure 30 in FIG. 4.

According to process S3, photoresist 300 is deposited on high-k dielectric material 500 using currently known methods or later developed techniques. Photoresist 300 (FIG. 2a) is patterned according to a desired design/layout using currently known or later developed techniques to form a photoresist mask 301 (FIG. 2b).

In process S4, high-k dielectric material 500 (FIG. 2b) disposed on the high-k 200 (FIG. 2b) is patterned according to the patterned photoresist mask 301 (FIG. 2b) using currently known or later developed techniques. Such techniques may include, but are not limited to: chemical mechanical polishing (CMP), reactive ion-etching (RIE), and plasma ashing.

Following the patterning of high-k dielectric material 500 in process S4, process S5a for removing photoresist mask 301 is executed using non-aqueous chemicals or organic solvents, for example, but is not limited to propylene glycol methyl ether acetate (PGMEA), ethyl lactate and isopropyl alcohol (IPA), to minimize potential damage by conventional plasma resist strip with oxygen ($O_2$), ammonia ($NH_3$) or tetrafluoromethane ($CF_4$).

Any residual photoresist material (not shown) may be removed according to a degas process S6 to convert all residual photoresist materials into volatile materials for easy removal. A degas process may be achieved with currently known or later developed methods, for example, annealing at a temperature of 100° C. at a pressure of approximately 5 Torr. The temperature of annealing may vary according to the pressure applied. According to the disclosed method, the temperature for converting the photoresist material into volatile materials may be maintained above a volatile point of approximately 150° C. to approximately 300° C. at a pressure of approximately 5 Torr. In the case of an oxygen free environment, annealing may occur at approximately 350° C. for approximately 5 minutes in a degas chamber to convert any residual photoresist material into volatile materials that escape from the surface of the wafer. In the case where the pressure is lowered, for example, at a pressure of approximately $1e^{-1}$ Torr the corresponding temperature may be lowered to a range of approximately 50° C. to approximately 70° C. and the duration of annealing is correspondingly shortened.

According to Scheme 10b, following processes S1 to S4, alternative process S5b replaces process S5a and S6. In process S5b (FIG. 1), other than ensuring an oxygen free environment, photoresist may be removed with a plasma forming gas ($N_2/H_2$), which includes a mixture of nitrogen and hydrogen; or by applying plasma ammonia ($NH_3$). The removal of photoresist according to process S5b is performed at a temperature ranging from approximately 50° C. to approximately 300° C. at a pressure of approximately 900 mTorr, preferably approximately 250° C. at a pressure of approximately 900 mTorr.

The alternative processes of S5a and S6, or S5b are carried out in an oxygen free environment to prevent oxidation. To ensure an oxygen free environment, the processes may be carried out in the environment of an inert gas, e.g. argon (Ar).

Figure 3:
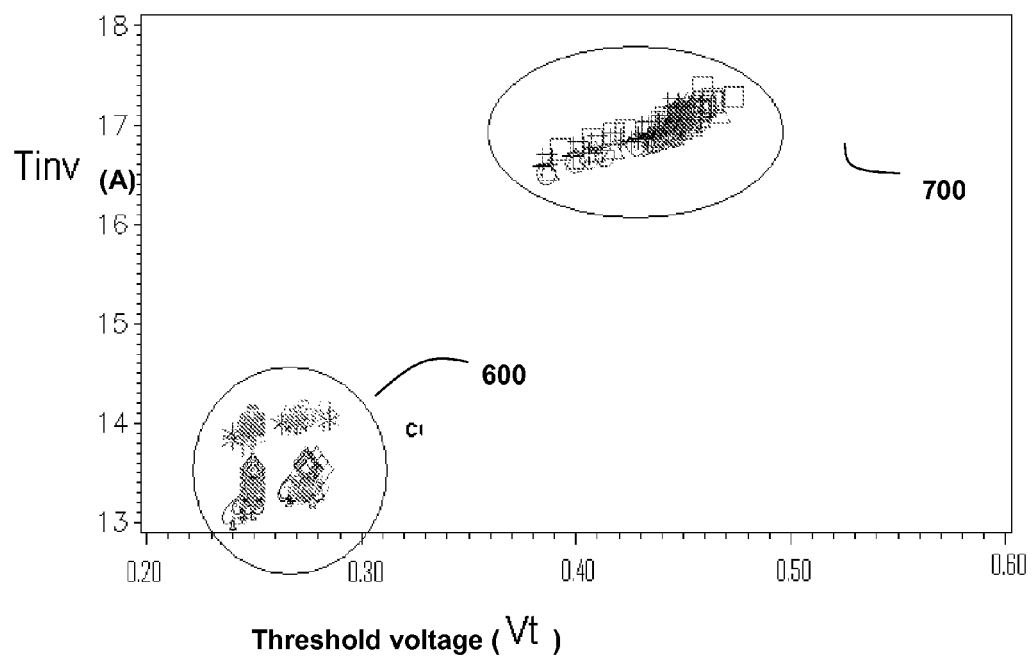
FIG. 3 is a graphical representation of the distribution of threshold voltage ($V_t$) and corresponding inversion thickness ($T_{inv}$) for a device fabricated where a photoresist mask is removed with and without degas process.
Figure 4:
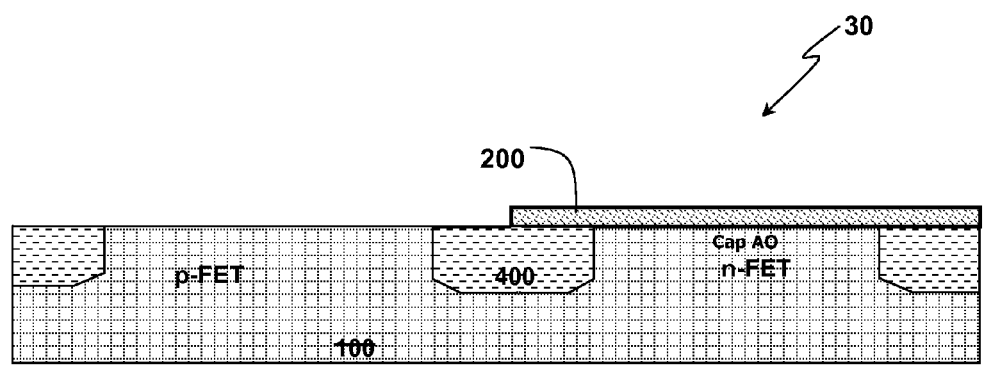
FIG. 4 is a cross-sectional view of an alternative embodiment of a semiconductor structure according to a method of the disclosure.

FIG. 3 illustrates the respective distribution of the threshold voltage ($V_t$) against the inversion thickness ($T_{inv}$) between two devices, where the photoresist mask of one of the devices is removed using the degas process and the photoresist mask of another is removed without using the degas process. In the case where control and degas 600 is applied for the removal process of photoresist mask 301 (FIG. 2b), the $V_t$ may range from approximately 0.23V to approximately 0.29V at corresponding $T_{inv}$ that may fall within a range of approximately 12.9 Å to approximately 14.3 Å. In the case where no control and degas 700 is applied in the removal process of photoresist mask 301 (FIG. 2b), the $V_t$ may range from approximately 0.38V to approximately 0.48V at corresponding $T_{inv}$ that may fall within a range of approximately 16.3 Å to approximately 17.6 Å. From the data distribution, the use of control and degas 600 reduces $V_t$ at lower corresponding $T_{inv}$ and the range of difference in $V_t$ is smaller than in the case without control and degas 700. This is attributed to the removal of any residual photoresist on the high-k dielectric material. The presence of residual photoresist, as illustrated by data distribution without control and degas 700, increases $V_t$ by a range of approximately 0.15V to approximately 0.19V at greater $T_{inv}$.

The foregoing description of various aspects of the disclosure has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor structure having a front-end-of-the-line (FEOL) device, the semiconductor structure comprising:
   a first high-k dielectric layer disposed on a substrate; and
   a second high-k dielectric layer on the first high-k dielectric layer, wherein the second high-k dielectric is patterned by:
   forming a photoresist mask on the second high-k dielectric layer;
   patterning the second high-k dielectric layer according to the photoresist mask; and
   removing the photoresist mask and any residual photoresist material using a solvent selected from a group consisting of: non-aqueous solvents and organic solvents; followed by annealing by a degas process conducted at a temperature corresponding to an applied pressure in an oxygen free environment.

2. The structure of claim 1, wherein the organic solvent includes a material selected from a group consisting of: propylene glycol methyl ether acetate (PGMEA), ethyl lactate and isopropyl alcohol (IPA).

3. The structure of claim 1, wherein the temperature ranges from approximately 150° C. to approximately 300° C. at a pressure of approximately 5 Torr.

4. The structure of claim 1, wherein the temperature ranges from approximately 50° C. to approximately 70° C. at a pressure of approximately $1e^{-1}$ Torr.

5. The structure of claim 1, wherein the second high-k dielectric is patterned with the removing including use of a plasma nitrogen-hydrogen forming gas ($N_2/H_2$).

6. The structure of claim 5, wherein the plasma forming gas is applied at a condition selected from a group consisting of: a temperature ranging from approximately 50° C. to approximately 300° C. at a pressure of approximately 900 mTorr; and a temperature at approximately 250° C. at a pressure of approximately 900 mTorr.

7. A semiconductor structure having a front-end-of-the-line (FEOL) device, the semiconductor structure comprising:
  a high-k dielectric layer disposed on a substrate, wherein the high-k dielectric is patterned by:
  forming a photoresist mask on the high-k dielectric layer;
  patterning the high-k dielectric layer according to the photoresist mask; and
  removing the photoresist mask and any residual photoresist material using a solvent selected from a group consisting of: non-aqueous solvents and organic solvents; followed by annealing by a degas process conducted at a temperature corresponding to an applied pressure in an oxygen free environment.

8. The structure of claim 7, wherein the organic solvent includes a material selected from a group consisting of: propylene glycol methyl ether acetate (PGMEA), ethyl lactate and isopropyl alcohol (IPA).

9. The structure of claim 7, wherein the temperature ranges from approximately 150° C. to approximately 300° C. at a pressure of approximately 5 Torr.

10. The structure of claim 7, wherein the temperature ranges from approximately 50° C. to approximately 70° C. at a pressure of approximately $1e^{-1}$ Torr.

11. The structure of claim 7, wherein the high-k dielectric is patterned with the removing including use of a plasma nitrogen-hydrogen forming gas ($N_2/H_2$).

12. The structure of claim 11, wherein the plasma forming gas is applied at a condition selected from a group consisting of: a temperature ranging from approximately 50° C. to approximately 300° C. at a pressure of approximately 900 mTorr; and a temperature at approximately 250° C. at a pressure of approximately 900 mTorr.

* * * * *